(12) United States Patent
Bilski

(10) Patent No.: US 6,477,699 B1
(45) Date of Patent: Nov. 5, 2002

(54) ELECTRONIC CIRCUIT DESIGNS ADAPTABLE FOR APPLICATIONS HAVING DIFFERENT BINARY DATA FORMATS

(75) Inventor: Goran Bilski, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/884,559

(22) Filed: Jun. 19, 2001

(51) Int. Cl.⁷ .............................................. G06F 17/50
(52) U.S. Cl. ......................... 716/18; 712/204; 395/785
(58) Field of Search ..................... 716/18, 17; 712/202; 711/100; 395/785, 380

(56) References Cited

U.S. PATENT DOCUMENTS 5,907,865 A * 5/1999 Moyer ........................ 711/201
6,021,259 A * 2/2000 Bahrs et al. ................ 358/1.15
6,341,345 B1 * 1/2002 Auslander et al. ............ 703/27

* cited by examiner

*Primary Examiner*—Don Wong
*Assistant Examiner*—Tuyet T. Vo
(74) *Attorney, Agent, or Firm*—LeRoy D. Maunu

(57) ABSTRACT

Method for implementing electronic circuit designs that are adaptable to different binary data formats. Separate packages are provided for the different binary data formats. The names of the constants and subtypes are identical as between the packages, and the values associated with the constants and subtypes in each of the packages are particular to the associated data format. A selected one of the packages is imported into the. design, and selected references in the design to binary data are made using the names of the constants and subtypes set forth in the packages. The circuit design is then implemented by synthesizing and mapping the design to the selected device.

15 Claims, 2 Drawing Sheets

ELECTRONIC CIRCUIT DESIGNS ADAPTABLE FOR APPLICATIONS HAVING DIFFERENT BINARY DATA FORMATS

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention generally relates to designing electronic circuits, and more particularly to designing electronic circuits that are easily adaptable to different binary data formats.

BACKGROUND OF THE INVENTION

Big endian and little endian are two different formats for storage or transmission of binary data. In big endian, the most significant bit(s) and/or byte is on the left, and the reverse is true for little endian. Designers generally create designs that are specific to either the big endian or little endian format, depending on application requirements.

Designs are typically tailored for either big or little endian, which does not support adaptability of designs from one endian design to another. If a design is created for one of the formats, for example, big endian, the designer may thereafter recognize a need for the design to be implemented to little endian requirements. However, to change a design that is tailored to big endian to a little endian design would require a great deal of effort since the design would have to be analyzed and restated to be consistent with little endian requirements. The reverse is also true for changing a design from little endian to big endian.

method that address the aforementioned problems, as well as other related problems, is therefore desirable.

SUMMARY OF THE INVENTION

In various embodiments, the invention provides a method for implementing electronic circuit designs that are adaptable to different binary data formats. Separate packages-are provided for the different binary data formats. The names of the constants and subtypes are identical as between the packages, and the values associated with the constants and subtypes in each of the packages are particular to the associated data format. A selected one of the packages is imported into the design, and selected references in the design to binary data are made using the names of the constants and subtypes set forth in the packages. The circuit design is then implemented by synthesizing and mapping the design to the selected device.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described in terms of big endian and little endian data formats and VHDL specifications. However, those skilled in the art will appreciate that the invention could be practiced with other data formats, using other design languages, and also used for a variety of electronic devices, for example, PLDs and ASICs.

The example embodiments of the invention include packages that set forth constant and subtype definitions that are used to reference data in a design. The names of the constants and subtypes are the same between packages. However, the constant and subtype values in each of the packages are specific to a selected data format. To implement a design to a selected data format, the corresponding package is imported into the design file and the design uses the constants and subtypes from the package to reference data. This allows the design to be easily changed to another data format by importing the corresponding package.

Figure 1:
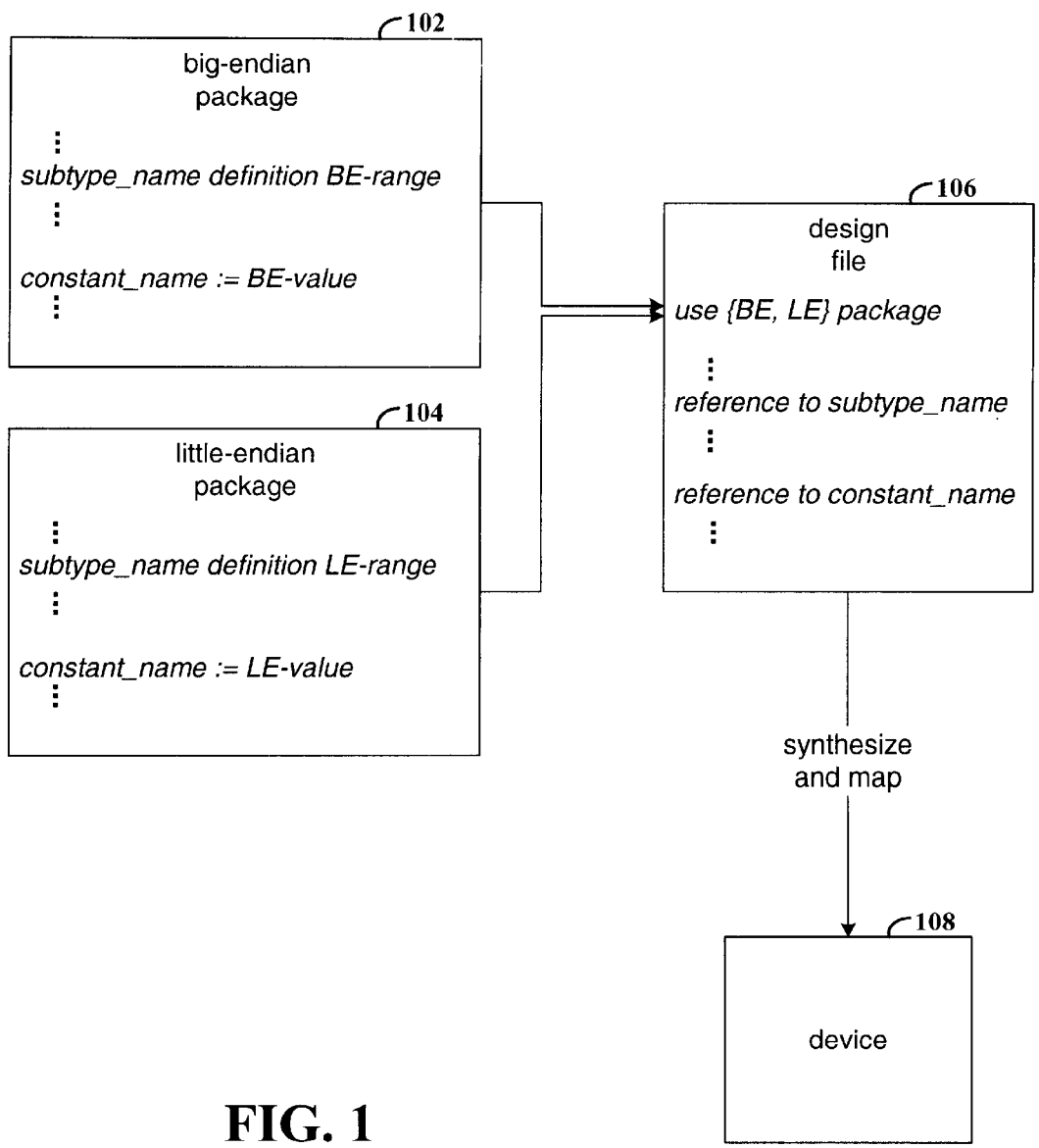
FIG. 1 is a block diagram that illustrates the relationships between big endian and little endian packages and a design that imports a selected one of the packages.

FIG. 1 is a block diagram that illustrates the relationships between big endian and little endian packages and a design that imports a selected one of the packages. Block 102 represents a package associated with the big endian data format, and block 104 represents a package associated with the little endian data format. Block 106 represents the design file into which a selected one of the packages 102 or 104 is imported, and device 108 is the device on which the design is implemented, for example, a programmable logic device or an ASIC.

Packages 102 and 104 both include constant and subtype definitions in which the names are the same but the values are those suitable for the particular data format. For example, package 102 includes a subtype_name with a value BE-range that is suitable for a big endian data format. Similarly, package 104 includes the same subtype_name with a value LE-range that is suitable for a little endian format.

Design file 106 specifies a circuit design in VHDL, for example. Depending on system requirements, one of packages 102 or 104 is imported into the design file. For example, the "use" statement selects one of the big endian or little endian packages for import into the design. In other parts of the design file, the names of the subtypes and constants are used to address the binary data. Since the big endian package and little endian package have the same constant and subtype names, only the imported package need change in order to change from one endian format to the other.

Design file 106 is synthesized and mapped to a particular device 108 using conventional software tools.

Figure 2:
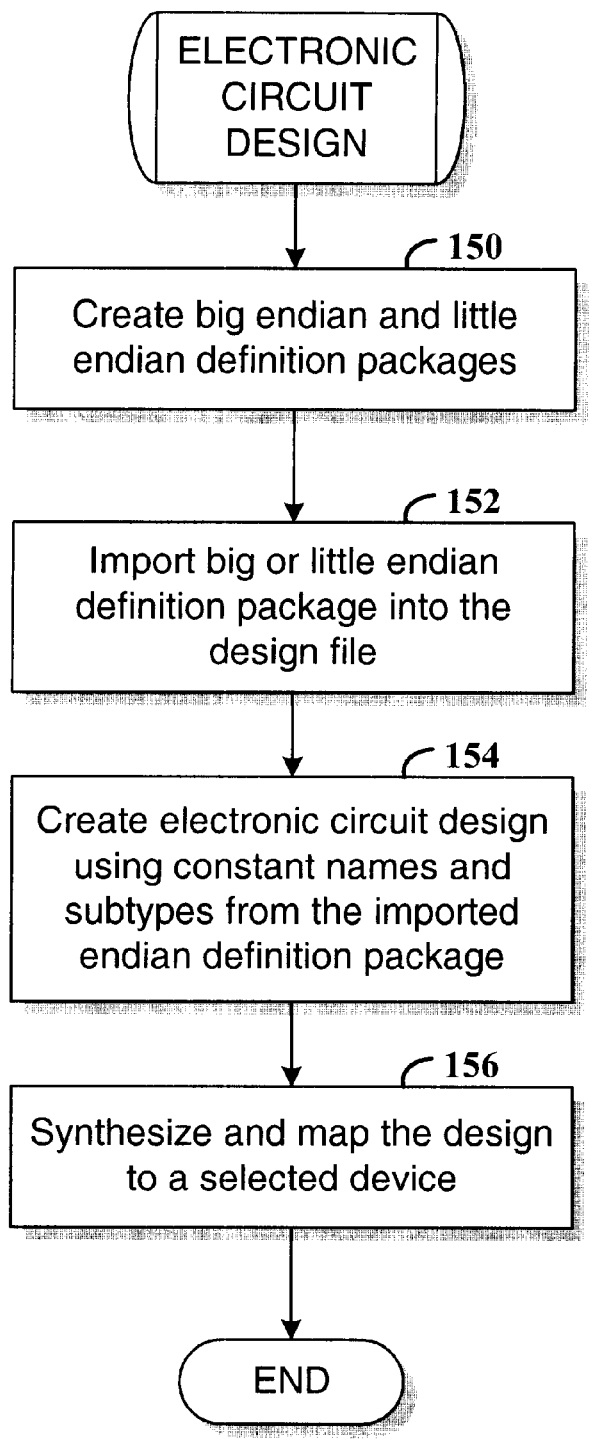
FIG. 2 is a flowchart of an example process for designing an electronic circuit in accordance with one embodiment of the invention.

FIG. 2 is a flowchart of an example process for designing an electronic circuit in accordance with one embodiment of the invention. The process is described by way of example big endian and little endian packages in combination with design files that import a selected one of the packages. At step 150, big endian and little endian packages are created. Example big and little endian packages are set forth on the code segments that follow. In each of the code segments, comments are preceded by a "- -" character sequence. The following code segment is an example package for big endian data references.

```
-- Big endian package
library IEEE;
use IEEE.std_logic_1164.all;
package ISA_pkg is
----------------------------------------------------
-- The packages for both the big and little endian packages
-- are named ISA_pkg so that the source file that includes
-- the package does not have to change to create different
-- implementations. In order to change from one endian to
-- the other, the user selects which file of the ISA_pkg to
-- use when running the implementation tools.
--------------------------------------------------------
    -- Constant definition
--------------------------------------------------------
    -- The value to be added for an index in a word to get to
    -- the next higher bit. The value is -1 for Big Endian
    -- since 31 is lsb and 30 is the next higher bit. The value
    -- is 1 for Little Endian since 0 is lsb and 1 is the next
    -- higher bit.
    constant NEXT_MSB_BIT   : integer    := -1;
    constant NEXT_LSB_BIT   : integer    := 1;
--------------------------------------------------------
    -- Type definitions
--------------------------------------------------------
    subtype INSTRUCTION_WORD_TYPE is
std_logic_vector(0 to 31);
    subtype QUADLET_TYPE is std_logic_vector(0 to 31);
    subtype DOUBLET_TYPE is std_logic_vector(0 to 15);
    subtype BYTE_TYPE is std_logic_vector(0 to 7);
    subtype DATA_WORD_TYPE is QUADLET_TYPE;
    subtype DATA_WORD_PLUS1_TYPE is
std_logic_vector(0 to 32);
    subtype DATA_WORD_MINUS1_TYPE is
std_logic_vector(1 to 31);
    subtype ADDR_WORD_TYPE is std_logic_vector(0 to 31);
    subtype REG_ADDRESS_TYPE is std_logic_vector(0 to 4);
    subtype IMM_WORD_TYPE is std_logic_vector(0 to 15);
    subtype ALU_OP_TYPE is std_logic_vector(0 to 1);
    subtype RESULT_SEL_TYPE is std_logic_vector(0 to 1);
--------------------------------------------------------
    Instruction decoding
--------------------------------------------------------
    -- Where in the Word the opcode is located
    subtype OPCODE_POS_TYPE is natural range 0 to 3;
    subtype OPCODE_TYPE is
std_logic_vector(OPCODE_POS_TYPE);
    -- Bit location if the instruction is an immediate
    -- instruction.
    constant IMMEDIATE_POS : natural     := 1;
    constant IMMEDIATE_DEC : std_logic := '1';
    -- Bit locations for Register address within the
    -- instruction.
    subtype WRITE_ADDR_POS_TYPE is natural range 4 to 8;
    subtype REG1_ADDR_POS_TYPE is natural range 9 to 13;
    subtype REG2_ADDR_POS_TYPE is natural range 14 to 18;
    -- Bit location for the immediate
    subtype IMMEDIATE_VALUE_POS_TYPE is natural range
16 to 31;
    -- ALU constants
    constant ALU_ADD    : ALU_OP_TYPE   := "00";
    constant ALU_SUB    : ALU_OP_TYPE   := "01";
    constant ALU_AND    : ALU_OP_TYPE   := "10";
    constant ALU_XOR    : ALU_OP_TYPE   := "11";
    -- Opcodes
    constant ADD_DEC    : OPCODE_TYPE   := "0000";
    constant SUB_DEC    : OPCODE_TYPE   := "0001";
    constant AND_DEC    : OPCODE_TYPE   := "0010";
    constant XOR_DEC    : OPCODE_TYPE   := "0011";
    constant ADDI_DEC   : OPCODE_TYPE   := "0100";
    constant SUBI_DEC   : OPCODE_TYPE   := "0101";
```

```
-continued constant ANDI_DEC   : OPCODE_TYPE   := "0110";
    constant XORI_DEC   : OPCODE_TYPE   := "0111";
    type OPCODE_MNEM_TYPE is (ADD, SUB, \and\, \xor\,
                              ADDI, SUBI, ANDI, XORI);
end package ISA_pkg;
```

The following code segment is an example package for little endian data references.

```
-- Little endian package
library IEEE;
use IEEE.std_logic_1164.all;
package ISA_pkg is
--------------------------------------------------------
    -- Type definitions
--------------------------------------------------------
    subtype INSTRUCTION_WORD_TYPE is std_logic_vector(31
                                                   downto 0);
    subtype QUADLET_TYPE is std_logic_vector(31 downto 0);
    subtype DOUBLET_TYPE is std_logic_vector(15 downto 0);
    subtype BYTE_TYPE is std_logic_vector(7 downto 0);
    subtype DATA_WORD_TYPE is QUADLET_TYPE;
    subtype DATA_WORD_PLUS1_TYPE is std_logic_vector(32
                                                   downto 0);
    subtype DATA_WORD_MINUS1_TYPE is std_logic_vector(30
                                                   downto 0);
    subtype ADDR_WORD_TYPE is std_logic_vector(31 downto 0);
    subtype REG_ADDRESS_TYPE is std_logic_vector(4 downto 0);
    subtype IMM_WORD_TYPE is std_logic_vector(15 downto 0);
    subtype ALU_OP_TYPE is std_logic_vector(1 downto 0);
    subtype RESULT_SEL_TYPE is std_logic_vector(1 downto 0);
--------------------------------------------------------
-- Instruction decoding
--------------------------------------------------------
-- Where in the Word the opcode is located
    subtype OPCODE_POS_TYPE is natural range 31 downto 28;
    subtype OPCODE_TYPE is std_logic_vector(OPCODE_POS_TYPE);
    -- Bit location if the instruction is an immediate
    -- instruction
        constant IMMEDIATE_POS  : natural       := 1;
        constant IMMEDIATE_DEC  : std_logic     := '1';
    -- Bit locations for Register address within the
    -- instruction
    subtype WRITE_ADDR_POS_TYPE is natural range
27 downto 23;
    subtype REG1_ADDR_POS_TYPE is natural range 22 downto 18;
    subtype REG2_ADDR_POS_TYPE is natural range 17 downto 13;
    -- Bit location for the immediate
    subtype IMMEDIATE_VALUE_POS_TYPE is natural range 15
                                                   downto 0;
    -- ALU constants
    constant ALU_ADD    : ALU_OP_TYPE   := "00";
    constant ALU_SUB    : ALU_OP_TYPE   := "01";
    constant ALU_AND    : ALU_OP_TYPE   := "10";
    constant ALU_XOR    : ALU_OP_TYPE   := "11";
    -- Opcodes
    constant ADD_DEC    : OPCODE_TYPE   := "0000";
    constant SUB_DEC    : OPCODE_TYPE   := "0001";
    constant AND_DEC    : OPCODE_TYPE   := "0010";
    constant XOR_DEC    : OPCODE_TYPE   := "0011";
    constant ADDI_DEC   : OPCODE_TYPE   := "0100";
    constant SUBI_DEC   : OPCODE_TYPE   := "0101";
    constant ANDI_DEC   : OPCODE_TYPE   := "0110";
    constant XORI_DEC   : OPCODE_TYPE   := "0111";
    type OPCODE_MNEM_TYPE is (ADD, SUB, \and\, \xor\,
                              ADDI, SUBI, ANDI, XORI );
end package ISA_pkg;
```

At step 152, a selected one of the big endian and little endian packages is imported into a design file. The following code segment illustrates a design file into which the big or little endian package is imported. The "use" statement imports the selected package.

```
library IEEE;
use IEEE.std_logic_1164.all;
library Work;
-- The following statement imports a selected one of the big
-- or little endian packages. "Work" is a default library
-- into which packages and modules are compiled
use Work.ISA_pkg.all;
-- The entity file is the description of the interfaces to
-- the module ALU, and the following architecture file is the
-- actual implementation of the module ALU.
entity ALU is
    port (
        ALU_Op     : in ALU_OP_TYPE;
        Op1        : in DATA_WORD_TYPE;
        Op2        : in DATA_WORD_TYPE;
        ALU_Result : out DATA_WORD_TYPE
    );
end ALU;
```

The following code segment illustrates another design file into which the big or little endian package is imported. In addition, binary data are referenced using the constants and subtypes of the imported endian package (step 154).

```
library ieee;
use ieee.numeric_std.all;
-- Since the ALU entity definition imported the endian
-- package, the definitions are inherited by the IMP
-- architecture.
architecture IMP of ALU is
begin -- IMP
    -------------------------------------------------------
    -- Generating the Arithmetic operations
    -------------------------------------------------------
    ALU_Operation: process (ALU_Op, Op1, Op2) is
    begin -- process ALU_Operation
        case ALU_Op is
            when ALU_ADD => ALU_Result <= std_logic_vector(
                unsigned(Op1) + unsigned(Op2));
            when ALU_SUB => ALU_Result <= std_logic_vector(
                unsigned(Op1) - unsigned(Op2));
            when ALU_AND => ALU_Result <= Op1 and Op2;
            when ALU_XOR => ALU_Result <= Op1 xor Op2;
            when others => null;
        end case;
    end process;
end IMP;
```

The following code segment illustrates the definition of a Decode entity into which an endian package is imported.

```
library IEEE;
use IEEE.std_logic_1164.all;
library work;
use work.ISA_pkg.all;
entity Decode is
    port (
        Clk    : in std_logic;
        Reset  : in boolean;
        -- Instruction bus control
        Instr     : in INSTRUCTION_WORD_TYPE;
        -- Register File signals
        Write_Addr : out REG_ADDRESS_TYPE;
        Reg1_Addr  : out REG_ADDRESS_TYPE;
        Reg2_Addr  : out REG_ADDRESS_TYPE;
        Reg_Write  : out boolean;
        -- Immediate value from the instruction word
        Imm_Value  : out IMM_WORD_TYPE;
        Arith control signals
        ALU_Op     : out ALU_OP_TYPE
    );
end Decode;
```

The following code segment illustrates an architecture definition of the Decode entity. The architecture uses the constants and subtypes of the imported endian package to reference data.

```
library IEEE;
use IEEE.std_logic_1164.all;
use IEEE.numeric_std.all;
library Work;
use Work.ISA_pkg.all;
architecture IMP of Decode is
    ----------------------------------------------------------
    -- Instruction aliases
    ----------------------------------------------------------
    alias instr_Dec : OPCODE_TYPE is Instr(OPCODE_POS_TYPE);
begin -- IMP
    ----------------------------------------------------------
    -- Decode Read Addresses to Register File
    ----------------------------------------------------------
    Reg1_Addr <= Instr(REG1_ADDR_POS_TYPE);
    Reg2_Addr <= Instr(REG2_ADDR_POS_TYPE);
    Write_Addr <= Instr(WRITE_ADDR_POS_TYPE);
    Write_Reg_Decode : process (Instr)
    begin -- process Write_Reg_Decode
        case instr_Dec is
            when ADD_DEC | ADDI_DEC | SUB_DEC | SUBI_DEC
                | AND_DEC | ANDI_DEC | XOR_DEC | XORI_DEC =>
                Reg_Write <= True;
```

```
            when others => Reg_Write <= False;
        end case;
    end process Write_Reg_Decode;
    ---------------------------------------------------------
    -- Decode Immediate values
    ---------------------------------------------------------
    Imm_Value <= Instr(IMMEDIATE_VALUE_POS_TYPE);
    ---------------------------------------------------------
    -- Decode for the ALU
    ---------------------------------------------------------
    -- ALU_Decode : process (Instr)
    begin -- process ALU_Decode
        case instr_Dec is
            when ADD_DEC | ADDI_DEC => ALU_OP <= ALU_ADD;
            when SUB_DEC | SUBI_DEC => ALU_OP <= ALU_SUB;
            when AND_DEC | ANDI_DEC => ALU_OP <= ALU_AND;
            when XOR_DEC | XORI_DEC => ALU_OP <= ALU_XOR;
            when others => ALU_OP <= ALU_ADD;
        end case;
    end process ALU_Decode;
end IMP;
```

The completed design is then synthesized and mapped at step 156. It will be appreciated that conventional or proprietary tools are available for this step.

The present invention is believed to be applicable to a variety of applications and has been found to be particularly applicable and beneficial in big endian and little endian applications. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for implementing an electronic circuit design on a selected device in a selected one of a first and second binary data formats, wherein the first format is different from the second format, comprising:

providing a first package having constants and subtypes having selected names and values for references to data in the first format;

providing a second package having constant and subtype names equivalent to the selected names of the constants and subtypes in the first package and values for references to data in the second format;

including a selected one of the first and second packages in the design;

defining selected references to data using the names of the constants and subtypes set forth in the packages; and synthesizing and mapping the design to the selected device.

2. The method of claim 1, further comprising including in the first and second packages subtypes and constants for decoding instructions.

3. The method of claim 1, further comprising including in the first and second packages subtypes for addressing an immediate value in an instruction.

4. The method of claim 1, further comprising including in the first and second packages constants for adjusting in positive and negative increments an index to bits within a word by reference to constant names that indicate a next most significant bit and a next least significant bit, respectively.

5. The method of claim 1, further comprising including in the first and second packages subtypes for referencing register addresses within an instruction.

6. The method of claim 1, wherein the first format is big endian and the second format is little endian.

7. The method of claim 6, further comprising including in the first and second packages subtypes and constants for decoding instructions.

8. The method of claim 6, further comprising including in the first and second packages subtypes for addressing an immediate value in an instruction.

9. The method of claim 6, further comprising including in the first and second packages constants for adjusting in positive and negative increments an index to bits within a word by reference to constant names that indicate a next most significant bit and a next least significant bit, respectively.

10. The method of claim 6, further comprising including in the first and second packages subtypes for referencing register addresses within an instruction.

11. A computer-implemented method for implementing an electronic circuit design on a selected device in a selected one of a plurality of binary data formats, wherein each of the formats is different one from another, comprising:

providing a plurality of packages having equivalently named constants and subtypes, wherein values associated with the constants and subtypes in each of the packages are particular to an associated one of the plurality of formats;

including a selected one of the plurality of packages in the design;

defining selected references to data using the names of the constants and subtypes set forth in the packages; and synthesizing and mapping the design to the selected device.

12. The method of claim 11, further comprising including in the plurality of packages subtypes and constants for decoding instructions.

13. The method of claim 11, further comprising including in the plurality of packages subtypes for addressing an immediate value in an instruction.

14. The method of claim 11, further comprising including in the plurality of packages constants for adjusting in positive and negative increments an index to bits within a word by reference to constant names that indicate a next most significant bit and a next least significant bit, respectively.

15. The method of claim 11, further comprising including in the plurality of packages subtypes for referencing register addresses within an instruction.

* * * * *